United States Patent [19]

Held

[11] Patent Number: 5,141,583
[45] Date of Patent: Aug. 25, 1992

[54] METHOD OF AND APPARATUS FOR CONTINUOUSLY FABRICATING LAMINATES

[76] Inventor: Kurt Held, Alte Strasse 1, D-7218 Trossingen 2, Fed. Rep. of Germany

[21] Appl. No.: 794,305

[22] Filed: Nov. 14, 1991

Related U.S. Application Data

[63] Continuation of Ser. No. 420,028, Oct. 11, 1989, abandoned.

[30] Foreign Application Priority Data

Oct. 14, 1988 [DE] Fed. Rep. of Germany ....... 3834993

[51] Int. Cl.⁵ .................. B32B 31/04; B30B 15/34; B30B 5/00
[52] U.S. Cl. .................. 156/324; 156/555; 156/578; 156/583.1; 156/583.5; 425/371; 100/93 RP
[58] Field of Search ............ 156/583.1, 583.5, 555, 156/324, 578, 78, 79; 100/93 RP; 425/371, 372

[56] References Cited

U.S. PATENT DOCUMENTS

| | | | |
|---|---|---|---|
| 2,511,703 | 6/1950 | Ettl | 156/555 |
| 3,671,355 | 6/1972 | Paymal | 156/324 |
| 4,004,870 | 1/1977 | Guttinger et al. | 425/371 X |
| 4,073,998 | 2/1978 | O'connor | 156/79 |
| 4,497,871 | 2/1985 | Henke | 156/300 X |
| 4,571,279 | 2/1986 | Oizumi et al. | 156/324 X |
| 4,579,612 | 4/1986 | held | 156/324 X |
| 4,687,528 | 8/1987 | Held | 156/324 X |
| 4,699,676 | 10/1987 | Held | 156/64 |

FOREIGN PATENT DOCUMENTS

| | | |
|---|---|---|
| 540762 | 10/1973 | Switzerland . |
| 86917 | 4/1917 | U.S.S.R. . |
| 138014 | of 1961 | U.S.S.R. . |
| 235968 | 9/1969 | U.S.S.R. . |
| 535894 | 12/1976 | U.S.S.R. . |
| 784996 | 12/1980 | U.S.S.R. . |
| 1207785 | 1/1986 | U.S.S.R. . |

Primary Examiner—David A. Simmons
Assistant Examiner—J. Sells
Attorney, Agent, or Firm—Anderson, Kill, Olick

[57] ABSTRACT

A method of and apparatus for continuously fabricating laminates formed of several layers of resin-impregnated material webs is carried out in combination with a double band press including a pair of endless press bands forming a pressing zone. Material webs free of resin are removed from a source and placed on a stretch of the run of at least one of the endless press bands at a location between a press outlet and a press inlet, and spaced from the pressing zone. The impregnation width and drying of the resin takes place at least partially on the stretch approaching the press inlet, that is before the pressure molding takes place. At the press inlet, the material webs are placed together formed a layered member and then are pressure molded, heated and/or cooled between coextensive stretches of the endless press bands to form the laminate. The resin is applied to the material webs from a resin applying device located between the press outlet and the press inlet outside of the pressing zone. The webs impregnated with the resin is guided along the stretch of the press band moving from the press outlet to the press inlet.

14 Claims, 4 Drawing Sheets

METHOD OF AND APPARATUS FOR CONTINUOUSLY FABRICATING LAMINATES

This is a continuation of application Ser. No. 07/420,028 filed Oct. 11, 1989, abandoned.

BACKGROUND OF THE INVENTION

The present invention is directed to a method of and apparatus for continuously fabricating laminates formed of several layers of resin-impregnated material webs by pressure molding the layers together and including removing the material webs free of resin from a source. The material webs are impregnated with a resin and then cured and dried and the resin is prehardened before passing the combined webs through a pressing zone of a double band press.

Laminates or layered materials are made up of several layers of material webs impregnated with thermosetting plastics material resin and pressure molded together in the desired sequence. Fiber or fabric webs are used as the material webs. Thermosetting resins usable for impregnating the webs are melamine, urea, phenolic, and epoxy resins or the like.

Such laminates can be used as decorative surface coverings for chip board. Decorative laminates include a core and a surface layer and the layers are composed of melamine or phenolic resin-impregnated papers. The surface layer deposited on the core layer is provided with a decorative imprint, such as an imitation wood grain.

In technical applications, laminates can be copper-covered or coated laminates serving as the initial material for the formation of printed circuit boards. Such copper-covered laminates are constructed of a core of several layers of glass cloth impregnated with an epoxy resin. An electrolytically deposited copper foil is placed on the surfaces of the core and is pressed molded together with it. Paper layers impregnated with phenolic resin can also be used as the core material.

In addition, there are laminates where the individual layers are impregnated with a thermoplastic resin. Such layers are arranged in a desired sequence, heated, press molded together and, subsequently, cooled. While thermosetting resins are cured by heat or chemical reaction, thermoplastic resins cure through cooling.

A method of and an apparatus for fabricating decorative laminates is disclosed in DE-AS 27 22 262. In this method, paper free of resin, is removed from rollers and passed through an impregnating device. Thermosetting resins, prehardened to a certain degree, is located in the impregnating device and is maintained in the liquid state, the so-called A-state, by means of solvents and water. The fiber matrix of the paper web is impregnated with the resin in the impregnating device. Subsequently, the resin-impregnated paper web is moved through a drying tunnel where a portion of the solvents and water contained in the resin is evaporated out of the paper web by applying heat. Due to the application of heat, the resin hardens or cures up to a maximum of the B-state. Subsequently, the paper webs are stacked in a desired manner and introduced into a double band press and press molded together along with the application of heat. The resin finally hardens to the C-state in the double band press and joins the individual layers into a compact laminate. After leaving the double band press the laminated webs are cooled, ground and, subsequently, wound on rollers. The apparatus as shown in the patent publication includes a double band press with take-off rollers for the paper webs located at the press inlet where the conventional impregnating device and drying tunnel are located.

This known device has the disadvantage, because of the arrangement of the impregnating and drying processes upstream of the pressure molding operation and the double band press, that the over-all length of the double band press installation is greatly increased. The resin-impregnated paper webs leaving the impregnating means are very prone to tear and, therefore, are very difficult to control over the long distance from the take-off location to the inlet of the double band press. This known and desirable method, because it is a single-stage method, has not been able to prevail against the two-stage method, where the paper webs are impregnated with resin, dried and, subsequently, again wound on rollers and are pressure-molded into a laminate, only in a second stage in the double band press.

Further, in this known method, it is also disadvantageous that the paper webs are very tacky after leaving the impregnating means and, as a result, cannot be supported and guided. Therefore, an intensive drying process in the drying tunnel is necessary, so that the paper web can advance unsupported to the inlet of the double band press. Such intensive heating, however, involves the danger of additional hardening or curing of the resin beyond the B-state. In addition, heating of the resin impregnated paper webs is required in the double band press to return the resin into a molten state, whereby a good interconnection can be achieved between the individual webs of the laminate. This heating step requires an additional supply of energy. Since the impregnation procedure is already terminated in the drying tunnel, resins rich in solvents and water must be used, to achieve a sufficient impregnation of the fiber matrix of the paper web. These solvents and water must be subsequently removed from the paper web in the drying tunnel, requiring additional energy. Moreover, the escaping solvent vapors result in considerable environmental problems and must be carried away by expensive installations.

A device for metering and applying resins for the impregnation of paper webs, and, particularly suitable for double band presses, is disclosed in DE -PS 31 14 592. This metering and applying device can be used in place of the conventional impregnating device disclosed in DE-AS 27 22 262. The metering and applying device is also arranged upstream of the double band press. This patent publication, however, cannot supply any suggestion to a person skilled in the art for the elimination of the above-mentioned disadvantages.

SUMMARY OF THE INVENTION

Therefore, the primary object of the present invention is to improve the single-stage method for continuous manufacture of laminates so that the length of the over-all apparatus is shortened and is not considerably greater than the double band press installation using a two-stage method and also provides for easier guidance of the material webs.

In accordance with the present invention, the material webs are applied to at least one of the endless bands of a double band press as the endless band moves from the outlet to the inlet with at least partial impregnation and drying of at least one of the material webs as it moves along a stretch of the endless band run between the outlet and the inlet as the endless band moves towards the inlet. Further, in accordance with the present invention, impregnating means comprising at least one device for applying resin to at least one of the material webs is located between the outlet zone and the inlet zone of the double band press and outside the pressing zone. The material web supplying means includes means for guiding the material web onto one of the stretches of the endless band run, located adjacent to the impregnating device with the stretch located between the press outlet and the press inlet outside of the press zone.

Additional preferred improvements of the invention are set forth in the claims. Thus the means for applying resin to the material web in the impregnating operation can be located in the region of the reversing drum at the press outlet and the material web can be placed by means of reversing rollers upon a returning stretch of the endless band run of the double band press. The returning stretch of the endless band can be heated by heat conducting elements or by infrared radiation or it can be heated by the reversing drums at the outlet side of the double band press which are designed to be heated, so that residual solvents contained in the resin can be removed and the resin can be further cured to a desired degree before entering the pressing zone of the double band press.

One of the advantages achieved by the present invention is that a part of the laminate production upstream of the pressure-molding location can be integrated into the double-band press itself. This feature shortens the length of the double band press installation and reduces the investment and operational costs and requires less personnel for operating the double band press installation. The material web is supported by the endless band during the impregnation step or directly following it, so that separate guidance and control of the material webs to the inlet into the double band press is not required. As a result, the danger of tears in the material web is completely eliminated which affords a reduction in waste, as well as a reduction in down time of the double band press installation.

The apparatus of the present invention permits the use of highly viscous resins with low solvent content. Such resins can also be completely free of water. Accordingly, only small amounts of solvent vapors develop, so that simple suction devices at the double band press are sufficient to remove the small amounts of solvent vapors present during operation. As a result, environmental problems caused by solvent vapors are avoided. In addition, the danger of defects by the inclusion of vapor bubbles in cavities during the pressure molding step is considerably reduced, affording a qualitative improvement of the laminates produced using the present invention. Furthermore, intensive drying of the resin-impregnated material webs and a subsequent remelting of the resin at the inlet to the double band press, is eliminated, with a considerable saving in energy.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described preferred embodiments of the invention.

DETAILED DESCRIPTION OF THE INVENTION

Initially, the present invention is described in a apparatus for continuously fabricating decorative laminates. A two-layer or a three-layer construction is usual in such continuously fabricated decorative laminates. A first layer comprises a core layer of thicker paper and a second layer formed of a ply of decorative paper, provided with a desired printing pattern. A third layer, in a three-layer arrangement, comprises a thin overlay paper. The decorative layer and the overlay layer contain more resin than the core layer and the overlay layer is transparent because of the thinner paper used. Usually, phenolic resin is utilized for impregnating the core layer with resin. Melamine resin is used mainly for the decorative and overlay layers.

Figure 1:
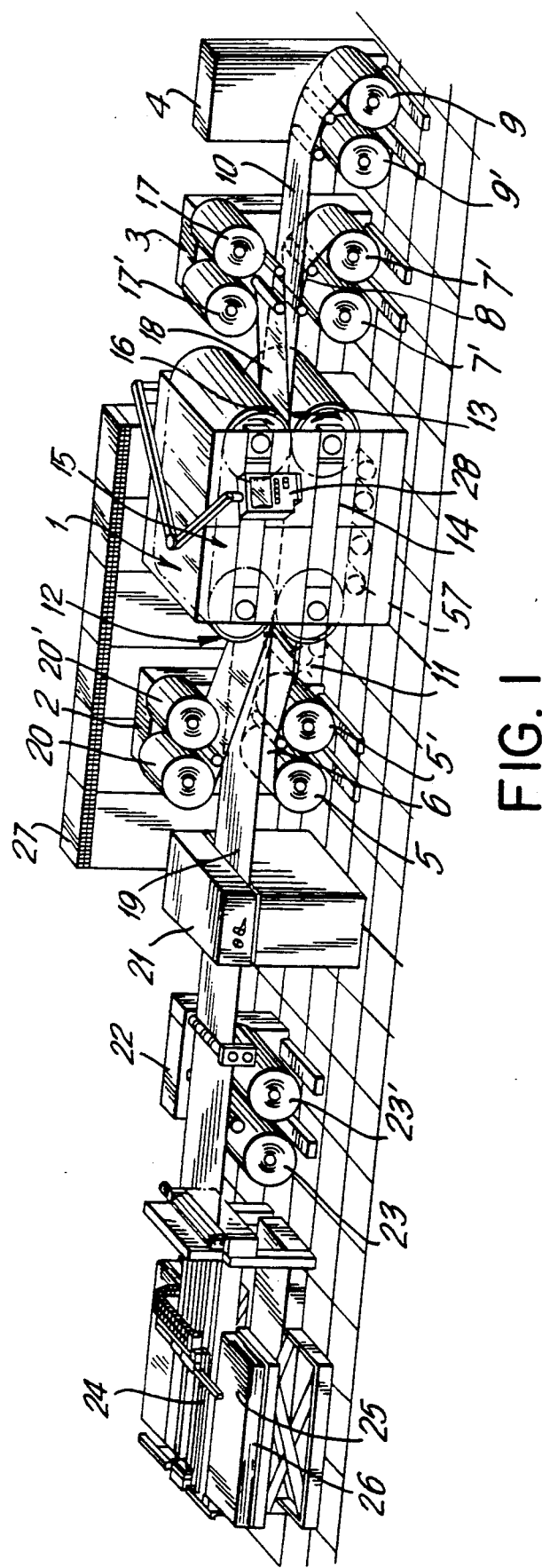
FIG. 1 is a side elevational view of a device for fabricating decorative laminates embodying the present invention.

The apparatus displayed in FIG. 1 serves for fabricating a textured three-layer decorative laminate. The apparatus includes a double band press 1 with additional devices arranged upstream and downstream from the press. A take-off roller unit 2 is located in the region of the outlet 12 from the double band press 1 and contains a roller 5 with core paper free of resin. A core paper web 6 is continuously drawn from the roller 5 and is conducted through a resin applying device 11 located at the outlet 12 of the double band press in the region of the lower press band 14. The device 11 contains resin. After leaving the resin applying device 11, the core paper web 6, impregnated with resin, is placed on a stretch 38 of the run of the band 14 in the double band press 1, moving toward the inlet 13. Stretch 38 carries the web 6 to the inlet 13. The impregnating and drying steps acting on the core paper web 6 are carried out according to the method of the present invention on the stretch 38 of the band 14 moving toward the inlet 13.

Two additional take-off units 3, 4 are located in front of the inlet 13 into the double band press 1. A roller 7 for a resin-impregnated decorating paper 8 is located in the take-off unit 3 and a roller 9 for resin-impregnated overlay paper 10 is located in the take-off unit 4. Decorating paper web 8 and overlay paper web 10 are continuously drawn off the rollers 7 and 9. These two webs are moved toward the inlet 13 of the double band press and are combined with the core paper web 6 present on the stretch 38 of the lower press band 14, so that a layered member 16 is formed subsequently constituting the decorative laminate. An additional roller 17 is present in the take-off roller unit 3 on which a release paper web 18 is supported and is removed and placed on the layered member 16 at the inlet 13 into the double band press 1, so that the release paper web 18 lies on the overlay paper web 10. Replacement rollers 5', 7', 9', 17' are positioned in the take-off units 2, 3, 4 for each of the rollers 5, 7, 9, 17, so that as one web approaches its end, the web on the corresponding replacement roller can be introduced to continue the formation of the laminate without any interruption in production.

Layered member 16 composed of the resin-impregnated paper webs 6, 8, 10 is press-molded in the double band press with the application of heat and area pressure into a decorative laminate 19 with the texture of the release paper web 18 impressed or embossed into the surface of the laminate. Release paper web 18 is separated from the laminate 19 in the region of the outlet 12 of the double band press and is coiled on a winding roller 20 forming part of the take-off roller unit 2. A replacement winding roller 20' for the release paper web 18 coming from the replacement roller 17', also forms a part of the take-off roller unit 2. Decorative laminate 19 is then transported at a uniform velocity through a cooling unit 21 downstream from the double band press. Subsequently, decorative laminate 19 can be rolled up in take-up roller station 22 on roller 23 or replacement roller 23'. Alternatively, decorative laminate 19 can be divided in a transverse cutting station 24 into panels 25 stacked on pallets 26. The entire double band press installation, as shown in FIG. 1, is controlled by a computer located in a switching control cabinet 27. Data input is accomplished by an operator through a visual data unit 28 by an operator.

Figure 2:
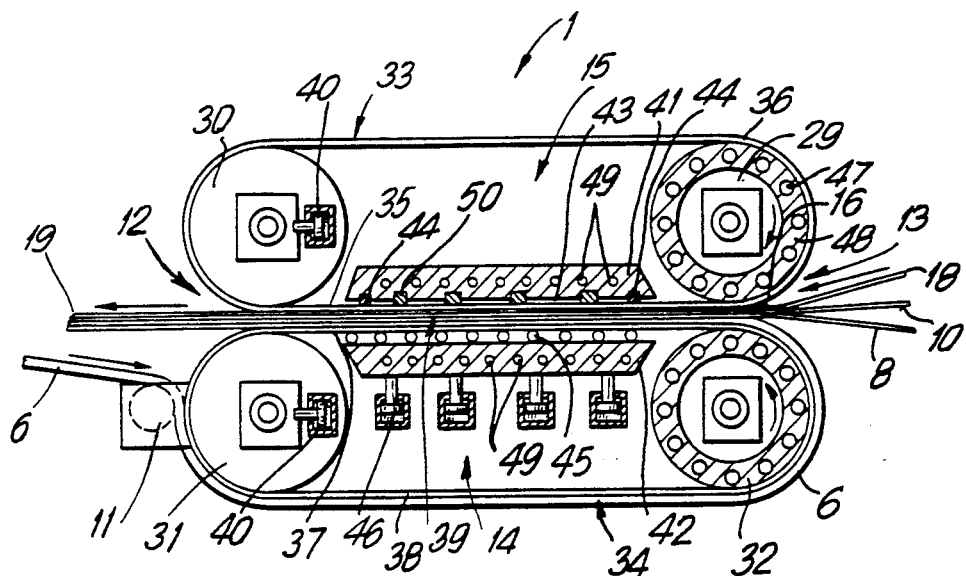
FIG. 2 is a sectional view of a double band press embodying the present invention.

Continuously operating double band press 1 is shown in greater detail in FIG. 2. Double band press 1 includes a lower press band 14 and an upper press band 15. Each press band 14, 15, is endless forming a continuous run divided into two stretches, one running from the inlet 13 to the outlet 12, and the other from the outlet 12 to the inlet 13. The two stretches of the press bands 14 and 15 extending from the inlet 13 to the outlet 12 form the pressing zone with the two stretches located in closely spaced relation. Each of the press bands 14, 15 includes two reversing drums 31, 32 or 29, 30. Upper press band unit 15 has an endless press band 33 extending around the reversing drums 29, 30, while the lower press band unit 14 has a press band 34 running around the reversing drums 31, 32. The four reversing drums 29, 30, 31, 32 are rotatably supported in a press stand, not shown in the drawing for reasons of clarity, so that the two press bands 33, 34 travel in the direction of the arrows shown on the reversing drums 29, 32. Upper press band 33 has a lower stretch 35 extending from the inlet 13 to the outlet 12 and an upper stretch 36 returning from the outlet 12 to the inlet 13. In the lower press band 34, the upper stretch 37 advances forward toward the outlet 12 and the lower band stretch 38 runs rearwardly toward the inlet 13. A reaction or pressing zone 39 is located between the lower advancing stretch 35 of the upper band 3 and the upper advancing stretch 37 of the lower press band 34. In the reaction zone 39, the layered body 16, made up of the resin-impregnated paper webs 6, 8, 10, moving in FIG. 2 from the right-hand side to the left-hand side, that is, from the inlet 13 to the outlet 12, is press-molded with the application of area pressure and heat. Usually, press bands 33, 34 are formed of a high-strength steel band stretched in a known manner, such as by hydraulic cylinders 40.

Area pressure exerted on the layered member 16 in the reaction zone 39 of the double band press 1 is applied hydraulically or mechanically by pressure plates 41, 42 located on an inner side of the press bands 33, 34 and is transferred by the press bands to the layered member 16 to be press molded. Reaction forces exerted by the layered member 16 are, in turn, introduced into the press stand by the pressure plates 41, 42.

If pressure is transmitted by hydraulic means, a fluid pressure medium to be subjected to pressure is introduced into a space between the pressure plate 41 and the inner surface of the press band 33, as shown in FIG. 2, within the upper press band unit 15. This space is a so-called pressure chamber 43 bounded laterally by a sliding face seal 44 sliding on the inner surface of the press band 33. Seal 44 is an annular member extending continuously around the chamber 43 and is fastened in the pressure plate 41. Preferably, synthetic oil is used as a pressure medium. It is also possible to use a gas, such as compressed air, as the pressure medium.

Stationary rollers 45 are located between the pressure plate 42 and the inner surface of the press band 34 for the mechanical generation of area pressure acting on the layered member 16, as shown in FIG. 2, as an example of the lower press band unit 14. Pressure plate 42, along with the rollers 45, are applied against the inner surface of the press band 34 by hydraulic cylinders 46.

It is possible to provide the pressure plate 41 with a mechanical pressure transmission system or the pressure plate 42 with a hydraulic pressure transmission system. Further, pressure transmission can be accomplished in a combined hydraulic/mechanical manner by using the two above-described systems simultaneously. For the transmission of heat required by the layered member 16 in the reaction zone 39 of the double band press 1, the reversing drums 29, 32 at the inlet 13 are designed to be heated. Accordingly, channels 47 are located in an outer contoured surface 48 of the cylindrical reversing drums 29, 32 at the inlet 13 of the double press band 1. A heating medium can be circulated through the channels 47, such as a thermal oil, for releasing heat by convection to the reversing drums 29, 32. Heat from the reversing drums 29, 32 is transmitted to the upper and lower press bands 34, 33 and then from the press bands into the reaction zone 39 to the layered member 16. Electrically operated calrods can be located in the jacket formed by the outer contoured surface 48 of the reversing drums 29, 32 at the inlet 13 of the double press band, in place of supplying heat by a heating medium circulated in the channels 47.

For additional heating of the layered member 16 in the reaction zone 39, or as a source of alternate heating, the pressure plates 41, 42 can be used as heating plates. For this purpose, channels 49 are formed in the pressure plates 41, 42 through which a heating medium flows. The heating medium supplies heat by convection to the pressure plates 41, 42 as it flows through the channels 49. Accordingly, pressure plates 41, 42 are heated to a temperature higher than the temperature of the press bands 33, 34 in the reaction zone 39. As mechanical pressure is transmitted, heat is transferred because of the temperature gradient between the pressure plate 42 and the press band 34 through the rollers 45 formed of a metal which is a good heat conductor. If hydraulic pressure transmission is used, heat conducting elements 50 are arranged in the pressure plate 41. These heat conducting elements 50 are formed of a material which is a good heat conductor and has good heat transmission contact with a surface of the pressure plate 41 and also contacts an inner surface of the press band 33 sliding over the heat conducting elements 50. Due to the temperature gradient between the pressure plate 41 and the press band 33, heat is transferred from the pressure plate through the heat conducting elements 50 into the press band 33. Such heat is then passed through the press band 33 to the layered member 16. A more detailed description of the heat conducting elements is found in DE-OS 33 25 578 and, therefore, is not included in this description.

Figure 3:
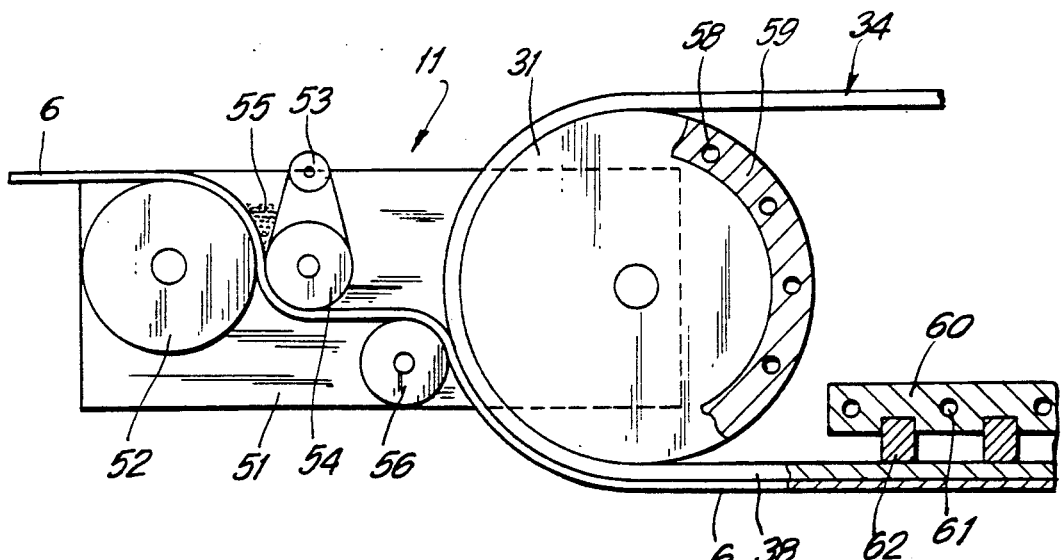
FIG. 3 is a partial sectional view on an enlarged scale of the double band press shown in FIG. 2, displaying a device for impregnating material webs with resin.

In FIG. 3, resin applying device 11 is shown for indicating in more detail the resin impregnation of the core paper web 6. The resin applying device 11 is located in a box-shaped stand 51, only a portion of which is displayed in FIG. 3 for reasons of clarity. Stand 51 is secured to the press stand at the reversing drum 31 of the lower press band unit 14 at the outlet 12 from the double band press 1. A back-up roller 52 extending across the width of the web is rotatably supported in the stand 51. Core paper web 6, not yet impregnated with resin, enters into the resin applying device 11 over back-up roller 52, and is applied against the back-up roller by a smaller metering roller 54 pivotally mounted about an axis 53. Metering roller 54 extends across the width of the resin applying device 11 and its axis is rotatably supported on the stand 51. In a space formed between the back-up roller 52 and the metering roller 54, which is sealed by the stand 51, a thermosetting resin 55, in its A-state serving for impregnating the core paper web 6, is located. A highly viscous resin containing very little solvent is used, such as a phenolic resin. Core paper web 6 passes continuously through the space containing the resin 55 formed by the gap between the support roller 52 and the metering roller 54 and the highly viscous resin 55 contains practically no solvents. The amount of the resin 55 deposited on the core paper web 6 is controlled by the travel speed of the web, the viscosity and the temperature of the resin 55 and the contact pressure of the metering roller 54.

The core paper web 6 containing the resin is then directed over a reversing roller 56, also rotatably supported in the stand 51. Reversing roller 56 applies the core paper web 6 to the stretch 38 of the endless pres band 34 in the region of the reversing drum 31. The impregnated core paper web 6 is transported by the stretch 38 in the direction toward the inlet 13. Another arrangement for the resin applying device 11 is set forth in DE-PS 31 14 592 and, as a result, is not further described.

As the stretch 38 of the press band 34 returns from the outlet 12 to the inlet 13 of the double band press 1, the core paper web 6 adheres to the stretch 38, since the resin 55 on the core paper web is a highly viscous resin, practically free of solvents. Side-by-side support or back-up rollers 57 can be used, as shown in FIG. 1, at the outside surface of the stretch 38 of the press band 34 for additional support of the press band and for secure prevention of detachment of the core paper web 6 from the press band 34. Such rollers 57 permit utilization of resins of low viscosity and high in solvent content in the process of the invention, although the use of a resin with a low solvent content is preferred.

In the method, according to the present invention, the steps of impregnating and drying the core paper web 6 are followed upstream of the pressure molding of the core paper web, with the other resin impregnated webs 8 and 10, and take place as the stretch 38 of the press band 34 approaches the inlet 13. Since the press bands 33, 34 are heated in the reaction zone 39, for the pressure molding of the layered member 16, they retain a certain amount of heat at the outlet 12. As a result, the core paper web 6 provided with resin 55 and bearing against the returning stretch 38, is heated as it moves toward the inlet 13 of the double band press, whereby due to the adherence of the core paper web to the stretch 38, a good heat transfer results between the press band 34 and the resin 55 on the core paper web 6.

Heating the resin 55 on the stretch 38 moving toward the inlet 13 of the double press band causes the resin to continue the curing operation. At the same time, it assumes a molten state due to the heating. In such a state, the resin penetrates into the core paper web 6 and is absorbed by the fiber matrix of the web. When the core paper web 6 reaches the lower reversing drum 32 at the inlet to the double band pres 1, note FIG. 2, the web is completely impregnated with resin and the resin is prehardened to the B-state. Due to the heating of the resin absorbed by the core paper web 6 it is in a gel phase at the inlet 13, that is, a semi-liquid state, as required for providing a bond between the individual paper webs 6, 8, 10 of the layered member 16 in the reaction zone 39 of the double band press 1. As compared to the conventional process, re-melting of the prehardened resin is eliminated advantageously in the method of the present invention with a resultant energy saving.

Because of the heating of the stretch 38, with the press band 34, the viscosity of the resin 55 is lowered and an adequate impregnation of the core paper web 6 is assured with highly viscous resins free of solvents or at least containing very little solvent. The small amount of solvents in the resin is evaporated by the heating process and can be removed by appropriate arrangement of aspirating means at the double band press 1 and then cooled. The condensate of the solvent can be returned for the preparation of the resin 55. If only a small amount of solvent is present, since the method uses resins with very little solvent, and because the small amount of solvent utilized is recovered and reused, hardly any solvent escapes into the environment. Accordingly, previously existing environmental problems in the fabrication of textured laminates are at least reduced. It must be especially emphasized that no water is required as an additional solvent whereby the danger of flaws in the decorative laminate due to the inclusion of vapor bubbles in cavities during pressure molding of the layered member 16 is avoided.

If the residual heat remaining in the press band 34 at the outlet 12 of the double band press 1 is inadequate for impregnation and further curing or hardening of the resin 55 contained in the core paper web 6, then the lower reversing drum at the outlet can also be heated. Accordingly, channels 58 are provided in the jacket 59 of the cylindrical reversing drum 31 at the outlet, as shown in FIG. 3. Reversing drum 31 and the press band 34 are heated at the outlet 12 by a heat carrier medium circulated though the channels 58. Finally, the heat is transferred from the press band 34 to the core paper web 6. Instead of channels, it is possible to place electrically operated cartridges into the jacket 59 of the reversing drum 31 for heating the drum.

To provide additional heat for the returning stretch 38 of the press band 34, a heating plate 60 can be positioned spaced a certain distance from the inner surface of the stretch 38. Channels or passageways 61 are formed in the heating plate 60 for conducting a heat carrier medium for heating the plate to a higher temperature than the press band 34. Heat conducting elements 62 are located in the heating plate 60, similar to the heat conducting elements 50, and are connected to one surface of the heating plate to assure good heat transfer contact and also are in contact with a surface on the inner side of the returning stretch 38 of the press band 34. Because of the temperature gradient between the heating plate and the press band, the heat is transmitted from the plate through the heat conducting elements 62 into the press band 34. This additional heat is then transferred from the press band 34 to the core paper web 6. Furthermore, instead of heating by means of the plate 60, infrared radiators can be arranged to heat the stretch 38 of the press band 34.

As described, the stretch 38 of the press band 34, returning to the inlet of the double press band 1, is used for the impregnating and drying steps. Naturally, the returning stretch 36 of the press band 33 of the upper press band unit 15, note FIG. 2, can also be utilized for this purpose and the resin applying device would then be attached to the reversing drum 30 at the outlet 12.

It is also possible to use the returning stretches of both press band units for the impregnating and drying steps. Such a device for continuous fabrication of a two-layer decorative laminate is depicted in FIG. 4.

Figure 4:
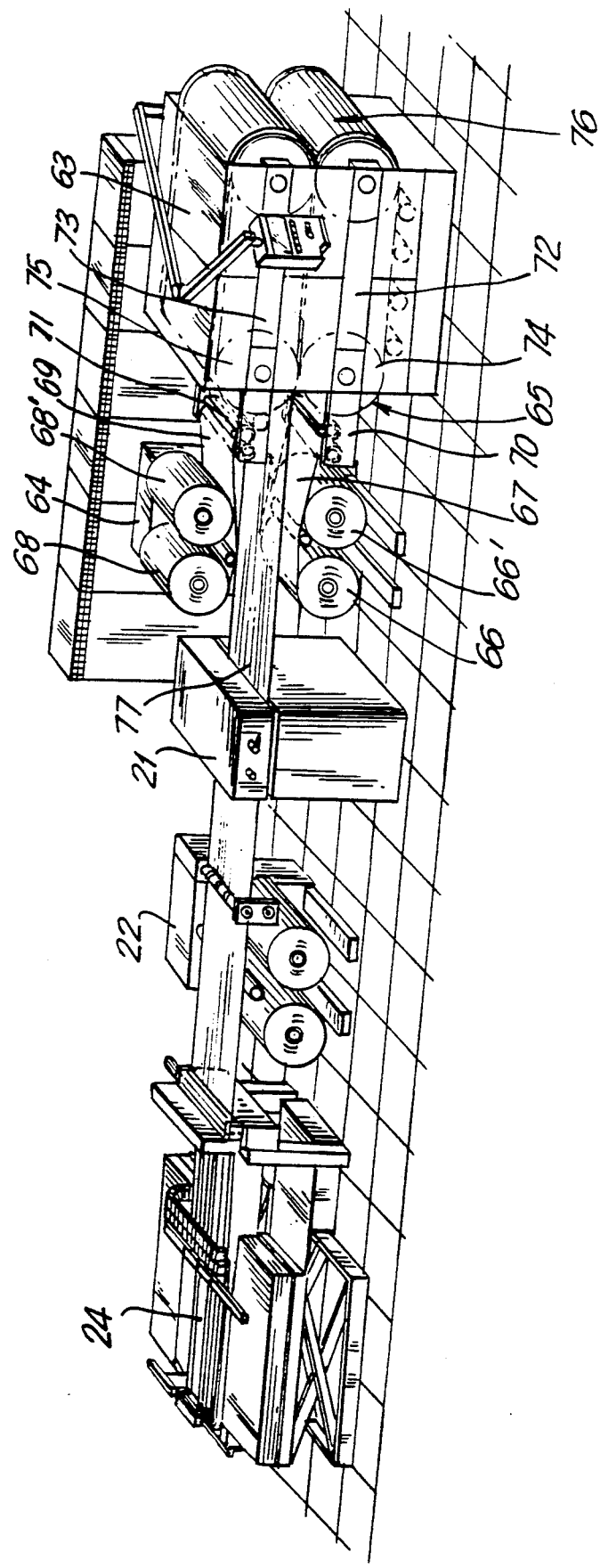
FIG. 4 is a view, similar to FIG. 1, of another device for fabricating decorative laminates displaying another embodiment of the present invention.

In FIG. 4, a take-off roll unit 64 is arranged in the region of the outlet 65 of the double band press 63. Take-off roll unit 64 includes a roller 66 for supplying the core paper web 67 and a roller 68 for the decorative paper web 69. Replacement rollers 66', 68' are positioned on the take-off unit 64 for both rollers 66, 68. The core paper web 67, along with the decorative paper web 69, are both free of resin and are drawn off the rollers 66, 68 and each is conducted through a separate resin application device 70, 71. Resin applying device 70 is positioned at the reversing drum 74 at the outlet 65 in the region of the lower press band unit 72, while the resin applying device 71 is arranged at the outlet 65 in the region of the upper press band unit 73. While the device 70 contains a highly viscous phenolic resin with little solvent for impregnating the core paper webs 67, a melamine resin for impregnating the decorating paper web 69 is located in the device 71. After the core and decorative paper webs 67, 69 have been provided with the resin in the resin applying devices 70, 71, each is placed on a returning stretch of the lower and upper press band units 72, 73. The press band units heat the impregnated webs so that the resin continues to cure or harden while at the same time impregnating the webs.

Paper webs 67, 69 containing resin are carried by the returning stretches of the press bands to the inlet 76 of the double band press 63 and at that location are combined into a layered member. The layered member is subsequently pressure molded in the double band press with the application of heat and area pressure forming a two-layer decorative laminate 77, which exits from the double band press at the outlet 65. The two-layer decorative laminate is passed through a cooling device 21 and a windup station 22 or, alternately, through a transverse cutting station 24 as has been described above.

The resin is applied on the surface of the paper web in a highly viscous liquid state in the resin applying devices 11, 70, 71, however, it is also possible to apply the resin in a powdered form by scattering or spraying it on the surface of the paper web in the vicinity of the outlet and thereafter placing the paper web upon the returning stretch of the press band. Thus, resin in powdered form melts under the effect of heat in the returning stretch, penetrates into the fiber matrix of the paper web, and impregnates it. At the same time, the resin continues to cure.

Laminates for technical uses can also be fabricated by the above method and apparatus as described for fabricating decorative laminates. Material webs free of resin and the appropriate resins are used for the laminates intended for technical applications.

Figure 5:
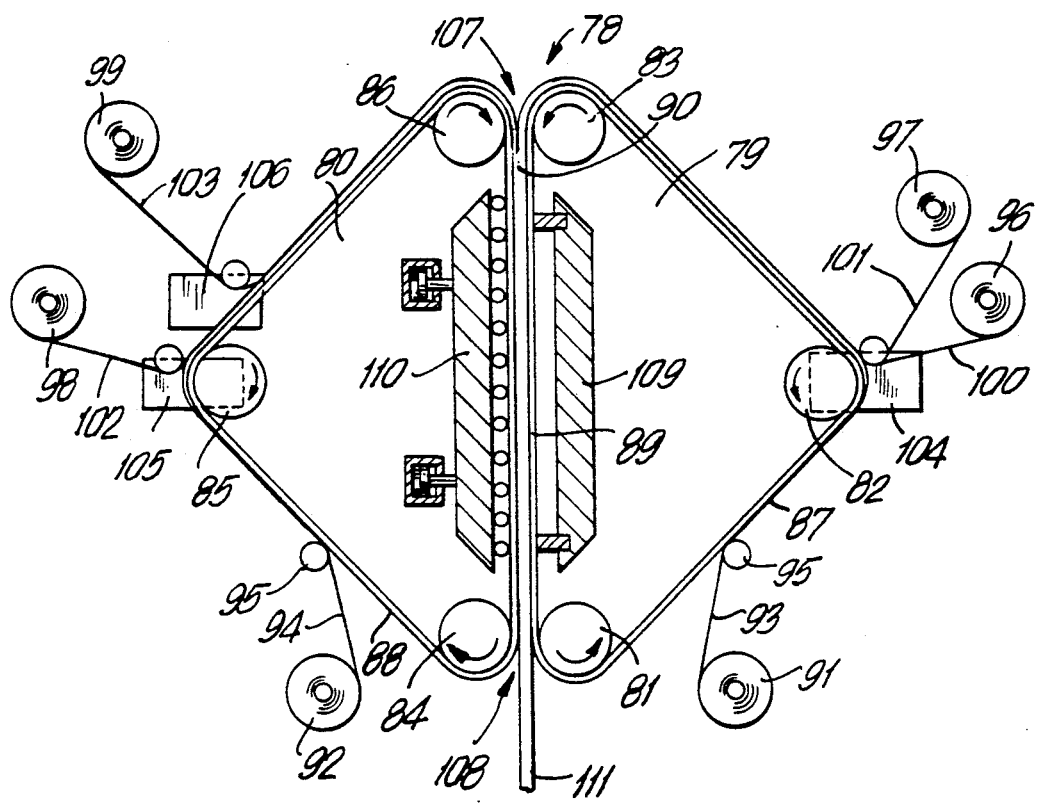
FIG. 5 illustrates a device for fabricating copper-covered laminates in accordance with the present invention.

Another embodiment of the present invention for fabricating copper-covered laminates is displayed in FIG. 5. In this embodiment, double band press 78 is formed of two vertically extending press band units 79, 80. Each press band unit 79, 80, has three reversing drums 81, 82, 83 or 84, 85, 86, arranged in the shape of an isosceles triangle over which an endless press band 87, 88 is stretched. Accordingly, each press band 87, 88 has three stretches in its endless run. The two press band units 79, 80 are positioned in a press stand, not shown, with the bases or stretches of the double band presses arranged vertically and forming the reaction zone 89 between them. The pressure acting on the press bands 87, 88 in the reaction zone 89 is supplied mechanically or hydraulically by pressure plates 109, 110 against the inner surfaces of the vertical stretches of the press bands 87, 88 and is transferred to the layered member 90 to effect the pressure molding step. The mechanical or hydraulic pressure transmission concept has been described above for the double band press 1 in FIG. 2.

Take-off units are located in the region of the reversing drums 81, 84 adjacent the outlet of the double band press, and these units include rollers 91, 92 on which the copper foil webs are wound. Copper foil webs 93, 94 are continuously withdrawn from the rollers 91, 92 and placed by reversing rollers 95 on the continuously moving stretches of the press bands 87, 88 located between reversing drums 81, 82 and 84, 85. The copper foil webs 93, 94 are conveyed with the press bands 87, 88 toward the reversing drums 82, 85 and are preheated by the heated press bands 87, 88.

Other take-off roller units are located in the region of the reversing drums 82, 85 located at the apex of the isosceles triangle, that is, the drums spaced from and between the outlet and the inlet. These take-off roller units have rollers 96, 97 and 98, 99 with glass fabric free of resins wound on them. The glass fabric webs 100, 101 are drawn from the rollers 96, 97 and pass through a resin applying device 104.

Resin applying device 104, similar to the resin applying device 11, described in greater detail with regard to FIG. 3, is arranged at the reversing drum 82 and contains a highly viscous epoxy resin with very little solvent. As the glass fabric webs 100, 101, free of resin, are passed through the resin applying device 104, they are coated with epoxy resin and then placed on the press band 87 at the reversing drum 82.

The copper foil web 93 and the glass fabric webs 100, 101 are applied on one another so that they are conveyed in the direction of the reversing drum 83 by the stretch of the press band 87 running from the drum 82 toward the drum 83 at the inlet 107. Heat is transferred from the press band 87 through the copper foil web 93 to the glass fabric webs 100, 101 coated with epoxy resin and any residual solvent in the resin is vaporized. At the same time, the epoxy resin continues to cure, becomes molten and penetrates into the glass fabric matrix, whereby the glass fabric webs 100, 101 are impregnated with the epoxy resin. The required heat can be supplied to the press band 87 through the reversing drums 81, 82 or through heating plates located on the inner surface of the press band 87, and provided with heat bridges such as shown in FIG. 3, in the event the residual heat of the stretch of the press band 87 returning to the inlet is inadequate. A heating of the returning stretch of the press band 87 or direct heating of the glass fabric webs, 100,101 containing resin can be effected by infrared radiators.

In the press band unit 79, on the right-hand side of FIG. 5, the epoxy resin is supplied to both glass fabric webs 100, 101 in a single resin applying device 104. It is possible, however, to provide a resin applying device for each of the glass fabric webs, as shown in the press band unit 80 on the left-hand side of FIG. 5. On the left-hand side, there are two resin applying devices 105, 106 located in the region of the reversing drum 85. A glass fabric web 102, free of resin, is continuously drawn off a roller 98, and is passed through the resin applying device 105 where it is coated with epoxy resin. Subsequently, the glass fabric web 102 is placed on the copper foil 94 already supported on the stretch of the press band 88 moving over the reversing drum 85 toward the inlet of the double band press. Another glass fabric web 103 is continuously withdrawn from the roller 99, passed through the second resin applying device 106 where it also receives epoxy resin.

The glass fabric web 103 exiting from the resin applying device 106 is placed on the glass fabric 102 already present on the stretch of the press band moving toward the inlet 107. Copper foil web 94 and the two glass fabric webs 102, 103 are conveyed toward the reversing drum 86 by the stretch of the press band extending between the reversing drums 85 and 86. During such movement, the epoxy resin impregnates the glass fabric matrix because of the effect of heat.

The heat is supplied to the press bands 87, 88 where their feed velocity or speed is selected so that the glass fabric webs 100, 101, 102, 103 are completely impregnated with the epoxy resin and the resin is prehardened to the B-state or the gelling point as they arrive at the reversing drums 83, 86 at the inlet to the double band press 78. The copper foil webs 93, 94 along with the impregnated glass fabric webs 100, 101, 102, 103 are reversed at the inlet and enter the reaction zone 89, and are combined so that a laminate 90 of resin impregnated glass fabric webs with the copper foil forming the outer layers of the laminate being formed. This laminate passes through the reaction zone 89 of the double band press 78 where it is pressurized molded with the application of heat and area pressure, so that the copper-covered laminate 111 leaves the double band press at the outlet 108 located between the reversing drums 81, 84. Subsequently, the copper covered laminate can be passed through known processing devices.

In the above embodiment, the layered core of the copper-covered laminate is made up of four fabric webs. The layered core can be formed of another number of webs, depending on the requirements. Accordingly, the resin applying devices would be provided in the required quantity. Naturally, the copper-covered laminate consisting of paper webs, provided with resins, can also be fabricated with the described device. Phenolic and other resins can be used for coating the material webs. Other laminates for technical application can be fabricated in such an apparatus in accordance with the present invention.

Figure 6:
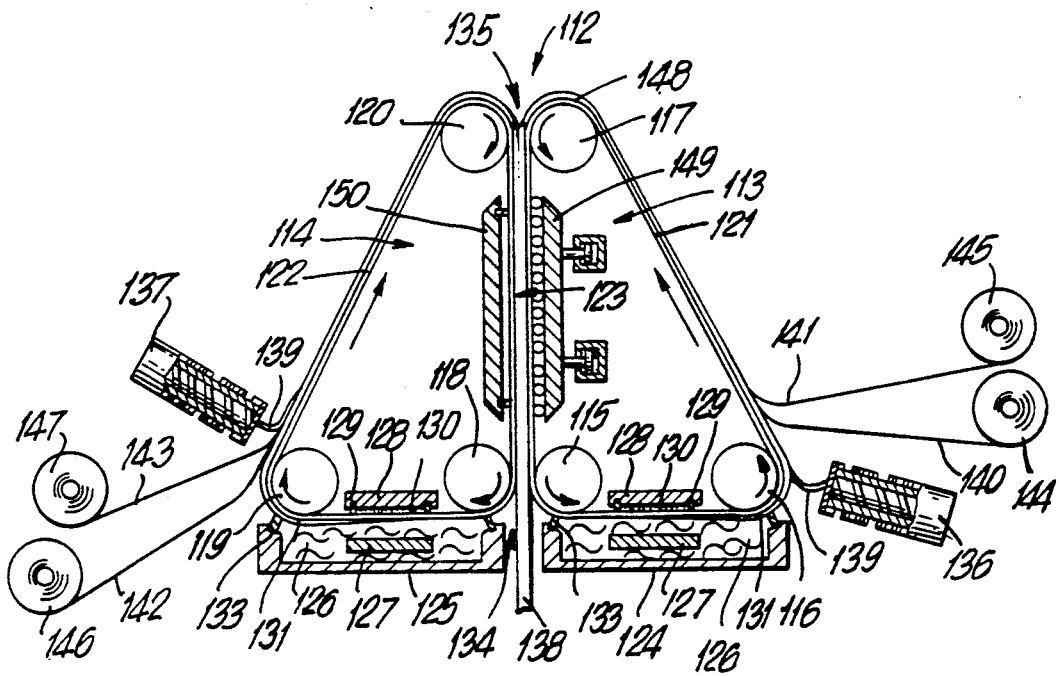
FIG. 6 is a view similar to FIG. 5, illustrating another arrangement for fabricating copper-covered laminates embodying the present invention.

Another apparatus for the continuous fabrication of the copper-covered laminates is provided in FIG. 6. This apparatus includes a double band press 112 made up of two vertically arranged press band units 113, 114. Each press band unit 113, 114 has three reversing drums, 115, 116, 117 or 118, 119, 120 with a press band 121, 122 trained over the drums so that each press band has a vertical stretch, a horizontal stretch and a third stretch joining the horizontal and vertical stretches. Accordingly, the reversing drums 115, 116, 117 and 118, 119 and 120 are arranged in the form of a rightangle triangle with the vertical stretches defining the reaction zone 123.

A galvanic copper bath 124, 125 is arranged at the outer surfaces of the press bands 121, 122 along the horizontal stretches extending outwardly from the outlet 134 of the double band press 112. The galvanic copper baths 124, 125 are shaped as tubs and are closed by seals 133 against the press bands 121, 122 and contain a bath fluid 126 including copper in the form of ions. In addition, a metallic plate 127 is located in the galvanic copper bath 124, 125 and the plate is in a circuit as an anode. Another metallic plate 128, acting as a cathode in the circuit, is located along the inner surface of the horizontal stretch of the press band above the copper bath 124, 125. A closed space located between the metallic plates 128 and the inner surfaces of the press bands 121, 122 is defined laterally by an annularly closed seal 129 secured to the plate 128. This space contains a metallic fluid 130. As a result, the press bands 121, 122, in the region of the copper bath 124, 125, act as a cathode in the circuit, so that a copper layer 131, 132 is deposited or precipitated upon the press bands 121, 122 and moves along with the press band. These copper layers 131, 132 each leave its copper bath 124, 125 in the region of the reversing drum 116, 119 and serve as a copper foil web for the copper-covered laminate being formed. Further details of such a galvanic copper bath for a double band press are set forth in DE-OS 35 15 629 and, accordingly, are not further described.

On the right-hand side in FIG. 6, an extruder 136 with a sheet die is positioned in the region of the reversing drum 116 with the opening of the die extending across the width of the copper foil 131. A highly viscous resin 139 containing small quantities of solvent and provided with a not particularly reactive hardener, serves for impregnating material webs for the layered material core of the copper-covered laminate 138 and is applied on the copper foil 131 by the extruder 136. Downstream of the extruder 136 in its moving direction, toward the inlet 135, material webs free of resin, such as glass fabric webs 140, 141 are continuously withdrawn from rollers 144, 145 and placed on the copper foil 131, moving with the angled stretch of the press band 121 toward the inlet 135. Resin 139 contacting the copper foil 131 is heated by the press band 121 through the copper foil and penetrates into the glass fabric webs 140, 141 so that the webs are impregnated with the resin. At the same time, any residual solvent is evaporated and the resin continues to cure.

Another variation for the application of the resin is displayed in connection with the press band unit 114 on the left-hand side of FIG. 6. Material webs free of resin, such as glass fabric webs 142, 143 are pulled from the rollers 146, 147 in take-off units, and are placed upon the copper foil 132 in the region of the reversing drum 119. From this location, the copper foil and the fabric webs are carried by the angled stretch of the press band 122 toward the inlet 135 of the double band press 112. As viewed in the moving direction of the press band 122, an extruder is located downstream of the location where the webs 142, 143 are applied to the press band. Extruder 137 has a sheet die extending transversely of the press band across the width of the glass fabric webs 142, 143 and the aperture of the die is located directly above the glass fabric webs. The extruder 137 extrudes a highly viscous resin 139 with very few solvents for impregnating the glass fabric webs 142, 143. While the stretch of the press band 122, returning toward the inlet 135, conveys the copper foil 132 and the glass fabric webs 142, 143, the resin extruded onto the webs is heated by the press band 122 and penetrates into the glass fabric matrix, so that the glass fabric webs 142, 143 are completely impregnated before reaching the inlet 135.

Copper foils 131, 132 with the impregnated glass fabric webs 140, 141, 142, 143 resting on them, are reversed at the drums 117, 120 at the inlet and combine to form a layered member 148. Layered member 148 enters the double band press 112 and is pressure molded in the reaction zone 123 with the application of heat and area pressure to form a copper lined laminate 138. The area pressure is provided by mechanical or hydraulic means in the reaction zone via pressure plates 149, 150 located at the inner surfaces of the press bands 121, 122 as described above. The copper coated laminate 138 leaves the double band press 112 at the outlet 134 in the region of the reversing drums 115, 118 and can undergo further processing in known apparatus.

The method of the present invention, as described with the aid of the above embodiments, is also basically suited for continuously fabricating laminates having material webs impregnated with thermoplastic resins. With such resins, the reaction zone is divided into a heating zone located adjacent the inlet of the double band press and a cooling zone adjacent the outlet of the press. Further, the portion of the pressure plates located in the cooling zone is cooled by providing passages in the pressure plate for a cooling agent. The heat in the cooling zone is transferred through the press band from the layered member being press molded into the pressure plate by heat conductive elements such as described above.

In the described embodiments disclosing the method of the invention, the impregnating and drying steps of at least one material web, upstream of the pressure molding step, are at least partially integrated into the double band press. Such integration results in a considerable saving in energy and materials as well as leading to a qualitative improvement of the over-all method. In addition, the apparatus of the invention can be constructed in a more compact manner than the known conventional apparatus.

While specific embodiments of the invention have been shown and described in detail to illustrate the application of the inventive principles, it will be understood that the invention may be embodied otherwise without departing from such principles.

I claim:

1. Method of continuously fabricating a laminate formed of several layers of resin-impregnated material webs and pressure molding the webs together, including the steps of removing material webs free of resin from a source, impregnating the webs with a resin curable by heat and curing the resin impregnated webs, drying the resin impregnated webs with prehardening of the resin and forming the resin impregnated webs into a combined layered member, introducing the combined layered member into a double band press comprising two endless bands each traveling over at least two spaced reversing drums and having an inlet and an outlet with first stretches of the endless bands extending from the outlet to the inlet and second stretches extending from the inlet to the outlet and disposed in closely spaced relation and pressure molding the combined layered member into a laminate between the second stretches of the endless bands by applying pressure, at least one of heating and cooling the laminate, removing the laminate from the double band press and one of coiling the laminate or separating the laminate into panels, placing at least one resin impregnated material web on one of the first stretches in the region of the reversing drum at the outlet and heating the one of the first stretches between the outlet and the inlet, effecting impregnation and drying of the material web before passing the material web between the second stretches, wherein the improvement comprises using a resin with little solvent for impregnating the material web and, in addition to residual heat, heating the one of the first stretches by heat conduction from at least one of the reversing drums at the outlet and a heating plate arranged within and at a distance from the endless band at the one of the first stretches thereof with heat conducting elements in contact with and extending between the heating plate and the first stretch of the endless band, and effecting the heating along the first stretch for the length thereof between the reversing drums at the outlet and the inlet.

2. Method, as set forth in claim 1, wherein carrying out the impregnating and drying steps for all of the material webs on first stretches of the endless bands of the double band press moving from the outlet to the inlet of the double band press.

3. Method, as set forth in claim 1 or 2, wherein introducing resin onto the material web in the region of the reversing drum at the outlet of the double band press, and conveying the resin containing material web on the first stretch of the endless band running from the outlet to the inlet of the double band press.

4. Method, as set forth in claim 1 or 2, using a resin free of water in the impregnating step.

5. Method, as set forth in claim 1 or 2, wherein applying the resin to a surface of the material web.

6. Method, as set forth in claim 5, wherein applying the resin in a highly viscous condition on the surface of the material web.

7. Method, as set forth in claim 6, applying the resin on the surface of the material web by means of a roller.

8. Method, as set forth in claim 6, wherein applying the resin by extruding the resin onto the material web.

9. Method, as set forth in claim 5, wherein applying the resin in powdered form onto the surface of the material web.

10. Method, as set forth in claim 9, wherein the sprinkling or spraying the resin in powdered form onto the surface of the material web.

11. Method, as set forth in claim 1, wherein vaporizing, solvents for escape from the resin during the drying of the material web, collecting the vaporized solvent, cooling the vaporized solvent and returning the cooled solvent to the resin to be applied to the material web.

12. Method, as set forth in claim 1, wherein using a thermosetting resin as the resin for impregnating the material webs.

13. Method, as set forth in claim 1, wherein using a thermoplastic resin as the resin for impregnating the material webs.

14. Method, as set forth in claim 12, wherein selecting the temperature and velocity of the endless bands so that the material web resting on the endless band is completely impregnated when arriving at the inlet into the double band press and with the resin hardened to the B-state.

* * * * *